United States Patent
Germer et al.

(10) Patent No.: US 7,065,457 B1
(45) Date of Patent: Jun. 20, 2006

(54) METHODS AND APPARATUS FOR UPDATING FIRMWARE IN AN ELECTRONIC ELECTRICITY METER

(75) Inventors: Warren R. Germer, Hampton, NH (US); Gregory P. Lavoie, Rochester, NH (US); Robert E. Lee, Jr., Rochester, NH (US); Maurice J. Ouellette, North Berwick, ME (US); Mark J. Plis, Barrington, NH (US); Virginia H. Zinkowski, E. Kingston, NH (US)

(73) Assignee: General Electric Company, Schenectady, NY (US)

( * ) Notice: Subject to any disclaimer, the term of this patent is extended or adjusted under 35 U.S.C. 154(b) by 1038 days.

(21) Appl. No.: 09/606,554

(22) Filed: Jun. 29, 2000

Related U.S. Application Data
(60) Provisional application No. 60/141,608, filed on Jun. 30, 1999.

(51) Int. Cl.
*G01R 19/00* (2006.01)

(52) U.S. Cl. .......................................... 702/64; 324/142
(58) Field of Classification Search .................... 702/57, 702/60, 61, 62, 64, 65, 80, 119, 123, 124, 702/183, FOR. 103, FOR. 104, FOR. 106, 702/FOR. 134; 324/110, 142; 340/870.02, 340/870.03
See application file for complete search history.

(56) References Cited

U.S. PATENT DOCUMENTS

| | | | |
|---|---|---|---|
| 4,884,021 A | 11/1989 | Hammond et al. | 324/142 |
| 5,068,962 A | 12/1991 | Germer et al. | 29/380 |
| 5,122,735 A | 6/1992 | Porter et al. | 324/142 |
| 5,136,644 A | 8/1992 | Audebert et al. | 380/251 |

(Continued)

FOREIGN PATENT DOCUMENTS
JP 411108728 A 4/1999

OTHER PUBLICATIONS

U.S. patent application Ser. No. 08/857,322, Lavoie et al., filed May 16, 1997.
U.S. patent application Ser. No. 09/606,270, Lavoie et al., filed Jun. 29, 2000.
U.S. patent application Ser. No. 09/606,602, Ouellette et al., filed Jun. 29, 2000.
U.S. patent application Ser. No. 09/606,649, Germer et al., filed Jun. 29, 2000.
U.S. patent application Ser. No. 09/606,769, Balch et al., filed Jun. 29, 2000.
U.S. patent application Ser. No. 09/606,881, Lavoie et al., filed Jun. 29, 2000.
U.S. patent application Ser. No. 09/606,883, Germer et al., filed Jun. 29, 2000.

*Primary Examiner*—Marc S. Hoff
*Assistant Examiner*—Mohamed Charioui
(74) *Attorney, Agent, or Firm*—Karl A. Vick, Esq.; Armstrong Teasdale LLP

(57) ABSTRACT

The present invention, in one embodiment, is a method for operating an electronic electric meter having current and voltage sensors configured to generate measurements of current and voltage, respectively; a microcomputer coupled to the current and voltage sensors and having on-chip masked read only memory (ROM); and a nonvolatile, alterable memory coupled to the microcomputer. The method includes steps of: storing vectors pointing to program portions of the ROM in the non-volatile memory; and using the stored vectors to operate the microcomputer to execute the program portions stored in the ROM to control operation of the meter.

18 Claims, 5 Drawing Sheets

U.S. PATENT DOCUMENTS

| | | |
|---|---|---|
| 5,146,157 A | 9/1992 | Clarke et al. ............... 324/142 |
| 5,229,713 A | 7/1993 | Bullock et al. ............. 324/142 |
| 5,245,275 A | 9/1993 | Germer et al. ............. 324/142 |
| 5,289,115 A | 2/1994 | Germer et al. ............. 324/107 |
| 5,406,071 A | 4/1995 | Elms ...................... 250/214 A |
| 5,467,286 A * | 11/1995 | Pyle et al. .................. 702/62 |
| 5,495,167 A | 2/1996 | Cotroneo .................... 324/74 |
| 5,514,958 A | 5/1996 | Germer ...................... 324/74 |
| 5,525,898 A * | 6/1996 | Lee, Jr. et al. .............. 324/142 |
| 5,537,029 A | 7/1996 | Hemminger et al. ........ 324/142 |
| 5,548,527 A * | 8/1996 | Hemminger et al. .......... 702/62 |
| 5,631,843 A * | 5/1997 | Munday et al. ............ 700/286 |
| 5,742,512 A | 4/1998 | Edge et al. .................. 702/57 |
| 5,790,432 A | 8/1998 | Morys ........................ 702/91 |
| 5,924,051 A * | 7/1999 | Provost et al. ................ 702/61 |
| 6,081,204 A | 6/2000 | Lavoie et al. ............ 340/870.2 |

* cited by examiner

| Signal | Normal Mode | ID Mode | Address Mode | Read Mode | Write Mode |
|---|---|---|---|---|---|
| I/O_LATCH | 0 | 1 | Hi-to-Lo Transition | 0 | 0 |
| I/O_READ | 0 | 1 | 0 | 1 | 0 |
| I/O_WRITE | 0 | 0 | 0 | 0 | Hi-to-Lo Transition |
| I/O_DATA_0 | Hi-Z w/Pulldown | Address Bit 0 | Address Bit 0 | Input Bit 0 | Output Bit 0 |
| I/O_DATA_1 | Hi-Z w/Pulldown | Address Bit 1 | Address Bit 1 | Input Bit 1 | Output Bit 1 |
| I/O_DATA_2 | Hi-Z w/Pulldown | Address Bit 2 | Address Bit 2 | Input Bit 2 | Output Bit 2 |
| I/O_DATA_3 | Hi-Z w/Pulldown | Response Bit 0 | Sub-Address Bit 0 | Input Bit 3 | Output Bit 3 |
| I/O_DATA_4 | Hi-Z w/Pulldown | Response Bit 1 | Sub-Address Bit 1 | Lo-/Hi Nibble | Lo-/Hi Nibble |

FIG. 4

| Signal | ID Mode | Address Mode | Read Mode | Write Mode(Nib 0) |
|---|---|---|---|---|
| I/O_LATCH | 1 | Hi-to-Lo Transition | 0 | 0 |
| I/O_READ | 1 | 0 | 1 | 0 |
| I/O_WRITE | 0 | 0 | 0 | Hi-to-Lo Transition |
| I/O_DATA_0 | 1 | 1 | N/A | KYZ 1 Output |
| I/O_DATA_1 | 0 | 0 | N/A | KYZ 2 Output |
| I/O_DATA_2 | 0 | 0 | N/A | Switch 1 Output |
| I/O_DATA_3 | 1 | X | N/A | N/A |
| I/O_DATA_4 | 0 | X | N/A | 0 |

FIG. 5

| Signal | ID Mode | Address Mode | Read Mode(Nib 0) | Read Mode(Nib 1) | Write Mode(Nib 0) | Write Mode(Nib 1) |
|---|---|---|---|---|---|---|
| I/O_LATCH | 1 | Hi-to-Lo Transition | | | | |
| I/O_READ | 1 | 0 | | | | |
| I/O_WRITE | 0 | 0 | | | Hi-to-Lo Transition | Hi-to-Lo Transition |
| I/O_DATA_0 | 1 | 1 | Z1 Input | Z3 Input | KYZ 1 Output | Switch 3 Output |
| I/O_DATA_1 | 0 | 0 | Y1 Input | Y3 Input | KYZ 2 Output | Switch 4 Output |
| I/O_DATA_2 | 0 | 0 | Z2 Input | Z4 Input | Switch 1 Output | Switch 5 Output |
| I/O_DATA_3 | 0 | X | Y2 Input | Y4 Input | Switch 2 Output | Switch 6 Output |
| I/O_DATA_4 | 1 | X | 0 | 1 | 0 | 1 |

FIG. 6

METHODS AND APPARATUS FOR UPDATING FIRMWARE IN AN ELECTRONIC ELECTRICITY METER

CROSS REFERENCE TO RELATED APPLICATION

This application claims the benefit of U.S. Provisional Application No. 60/141,608, filed Jun. 30, 1999, entitled "Methods and apparatus for updating firmware in an electronic electricity meter," and which is hereby incorporated by reference in its entirety.

BACKGROUND OF THE INVENTION

This invention relates generally to electricity metering, and more particularly, to a programmable microcomputer based electricity meter having enhanced configurability.

Electronic electricity meters for metering multi-phase services typically include a digital signal processor (DSP) and a microcomputer. Certain functions and operations are separately performed in the DSP and microcomputer. By dividing the functionality between the DSP and microcomputer, communications of data and commands must be provided between the DSP and microcomputer. Such an architecture is complex.

In addition, such meters typically are programmed to perform certain functions. Although the meters are upgradeable, the types of upgrades that can be performed are limited to the tables and functions prestored in the meter. In addition, and in the past, increased functionality typically was a trade-off to cost. That is, adding functionality to the meter typically resulted in adding significant costs to the meter.

It would therefore be desirable to provide methods and apparatus for inexpensively upgrading an electronic electricity meter. It would also be desirable to provide methods and apparatus for upgrading an electronic electricity meter that are not limited to tables and functions prestored in the meter.

BRIEF SUMMARY OF THE INVENTION

There is therefore provided, in one embodiment of the present invention, a method for operating an electronic electricity meter having current and voltage sensors configured to generate measurements of current and voltage, respectively; a microcomputer coupled to the current and voltage sensors and having on-chip masked read only memory (ROM); and a nonvolatile, alterable memory coupled to the microcomputer. The method includes steps of: storing vectors pointing to program portions of the ROM in the non-volatile memory; and using the stored vectors to operate the microcomputer to execute the program portions stored in the ROM to control operation of the meter.

The above-described embodiment provides a method for inexpensively upgrading an electronic electricity meter.

BRIEF DESCRIPTION OF THE DRAWINGS

FIG. 4 is a table illustrating the I/O board addressing mode.

FIG. 5 is a mode diagram for a simple I/O board.

FIG. 6 is a mode diagram for a complex I/O board.

DETAILED DESCRIPTION OF THE INVENTION

Figure 1:
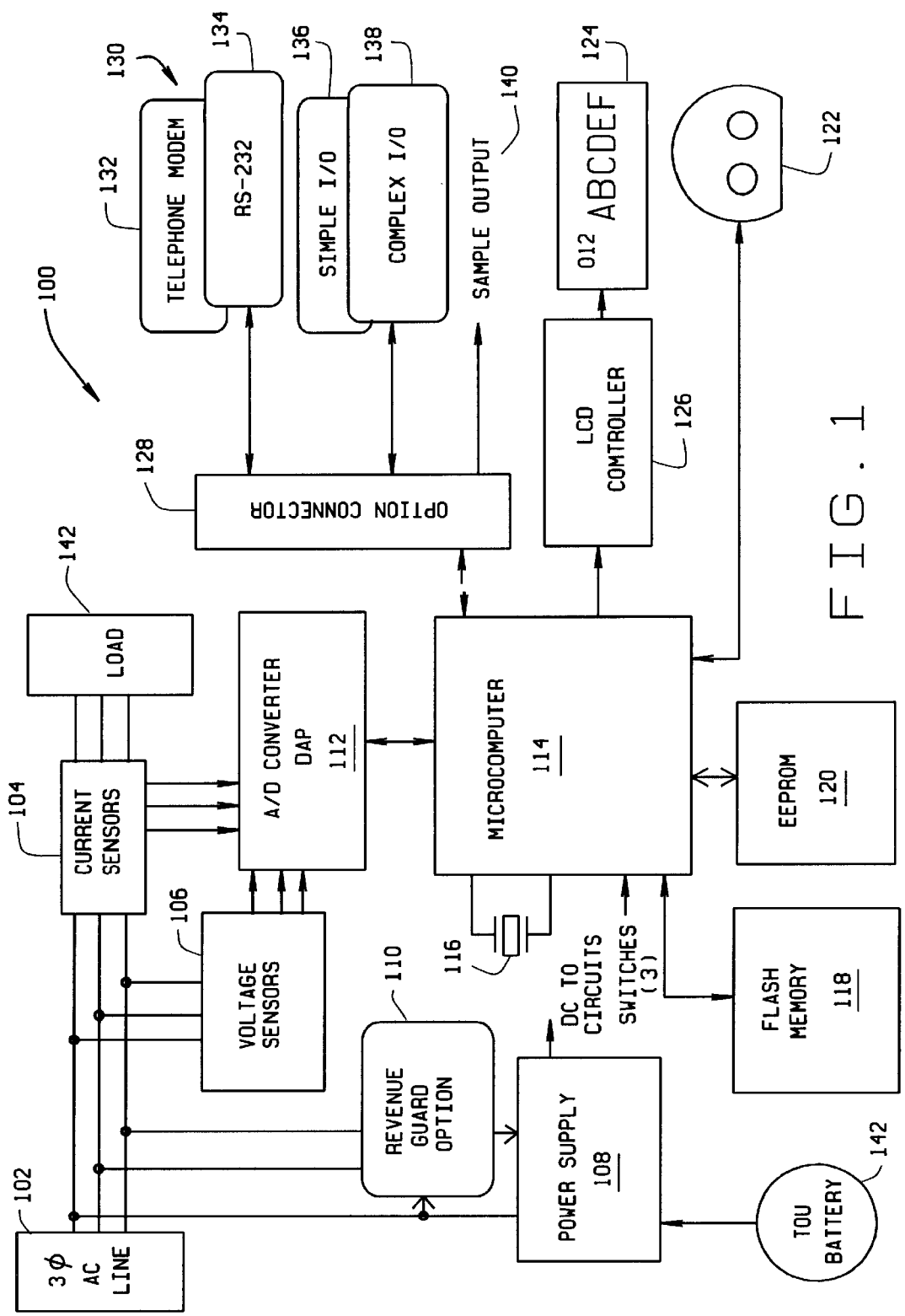
FIG. 1 is a block diagram of an electricity meter.

FIG. 1 is a block diagram of an electricity meter 100. Meter 100 is coupled to a three phase, alternating current (AC) power source 102. Particularly, current sensors 104 and voltage sensors 106 are coupled to power source 102 and generate measures of current and voltage, respectively. Current and voltage sensors 104 and 106 are well known in the art. In addition, a power supply 108 and a revenue guard option board 110 also are coupled to power source 102.

Current and voltage measurements output by sensors 104 and 106 are supplied to an analog-to-digital (A/D) converter 112. Converter 112, in the exemplary embodiment, is an 8 channel delta-sigma type converter. Converter 112 is coupled to a microcomputer 114. In the illustrated embodiment, microcomputer 114 is a 32 bit microcomputer with 2 Mbit ROM, 64 Kbit RAM. A 32 kHz crystal 116 provides a timekeeping signal for microcomputer 114. Microcomputer 114 is coupled to a flash memory 118 and a electronically erasable programmable (i.e., reprogrammable) read only memory 120.

Meter 100 also includes an optical port 122 coupled to, and controlled by, microcomputer 114. Optical port 122, as is well known in the art, is used for communicating data and commands to and from an external reader to microcomputer 114. Communications via port 122 are performed in accordance with ANSI C12.18 (optical port) and ANSI C12.19 (standard tables). A liquid crystal display 124 also is coupled to microcomputer 114 via an LCD controller 126. In addition, an option connector 128, coupled to microcomputer 114, is provided to enable coupling option boards 130 (e.g., a telephone modem board 132 or an RS-232 line 134, or a simple input/output (I/O) board 136 or a complex I/O board 138) to microcomputer 114. Option connector 128 also includes a sample output 140. When configured to operate in a time-of-use mode, a battery 142 is coupled to power source 102 to serve as a back-up to maintain date and time in the event of a power outage.

Figure 2:
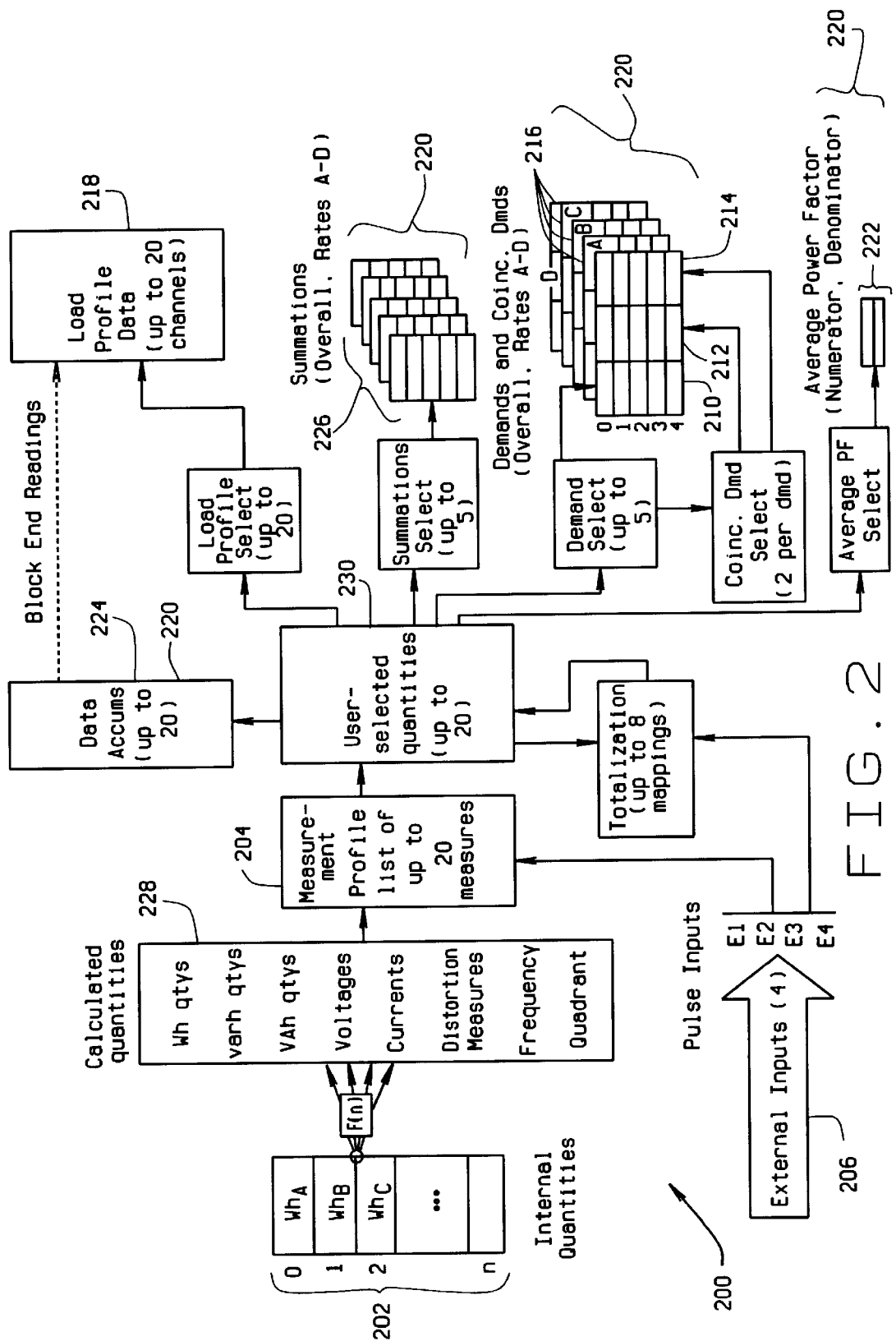
FIG. 2 is a data flow diagram for the electricity meter shown in FIG. 1.

FIG. 2 is a data flow diagram 200 for the electricity meter 100. As illustrated by FIG. 2, quantities such as watt hours per phase (WhA, WhB, WhC) as well as other quantities are determined by microcomputer 114. These quantities are sometimes referred to herein as internal quantities 202. Microcomputer 114 then uses the pre-defined or user-selected functions F(n) to calculate a set of quantities (referred to as calculated quantities 228). Microcomputer 114 then uses the measurement profile 204 to select up to 20 quantities to store as user-selected quantities. In addition, external inputs 206 can be specified to be accumulated by measurement profile 204. In the embodiment shown in FIG. 2, up to four external inputs (E1, E2, E3, E4) are collected. These may also be scaled by programmed multipliers and divisors.

User-selected quantities 230 specified by measurement profile 204 can be used to perform totalization. For example, a value from a register location in user-selected quantities 230 (e.g., register 7) can be added to a value stored in a register location (e.g., register 17) to provide a totalized value, and the totalized value is stored in a register location (e.g., register 17). In the embodiment illustrated in FIG. 2, up to 8 totalizations can be performed.

Also in the embodiment shown in FIG. 2, five demand values (locations 0–4) 210 can be calculated from the quantities in user-selected quantities 230. The values to use for the demand calculations are specified by the demand select. Each demand value may have up to two coincident demands 212, 214 per demand 210. The coincident demands are specified by the coincident select. A coincident demand value may be another one of the selected demands, or the quotient of two selected demands. An average power factor 222 is stored in numerator and denominator form. Time-of-use summaries (A–D) 216 for the selected demands are also available in a time-of-use meter. Up to 20 quantities can be recorded in load profile data 218. The quantities to be recorded are specified by the load profile select. Up to five summations 226 can be calculated. The quantities to be calculated are specified by the summations select. Time of use summaries (A–D) 216 for the selected summations are also available in a time-of-use meter. Data accumulations 224, summations 226, demands 210 coincident demands 212, 214, and time-of-use summaries 216 may be selected for display 210 on the meter's LCD.

Meter 100 can be programmed by an operator, e.g., a utility, so that meter 100 determines desired quantities, regardless of whether that quantity is a common, IEEE-defined value such as apparent volt-ampere-hours, or a quantity used only by a particular utility. Generally, a momentary interval is defined as 60 cycles (for 60 Hz installations) or 50 cycles (for 50 Hz installations) of the fundamental voltage frequency. Known meters calculate a pre-defined set of quantities from the basic quantities every momentary interval. These quantities include total watt-hours (fundamental plus harmnonics), apparent volt-ampere-hours, and arithmetic apparent volt-ampere hours. These quantities are summed by the minute. One-minute accumulations of data are stored in a structure called the minute first-in, first-out (FIFO) register. An example of the structure of a minute FIFO is illustrated below.

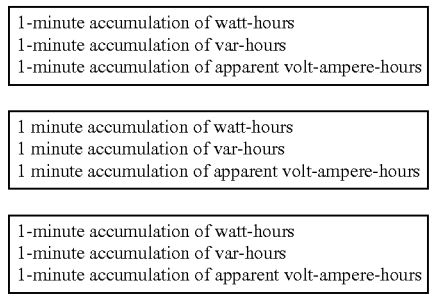

Data is retrieved from the minute FIFO and added to other accumulators, from which summations (e.g. total kilowatt-hours), demand calculations (e.g. maximum kilowatt demand), and load profile recording operations are performed.

Typically there is very little flexibility provided by electricity meters in how the momentary interval basic quantities are processed to generate the revenue quantities that are of interest to utilities. A user may, for example, select from several pre-defined quantities that are computed every momentary interval, and the user may select the length of the demand interval or subinterval and the length of the load profile interval.

In contrast, meter 100 enables a user to define methods of data calculations at all points in the data processing sequence, e.g, at the end of a momentary interval, at the end of a minute, at the end of a demand (sub)interval, and at the end of a load profile interval.

In another embodiment, code is downloaded into an external flash memory, and then a measurement profile is programmed to use the calculation specified by the code. Vectors are used to update and perform a list of tasks in ROM, or are replaced by versions in flash memory for other function blocks.

Figure 3:
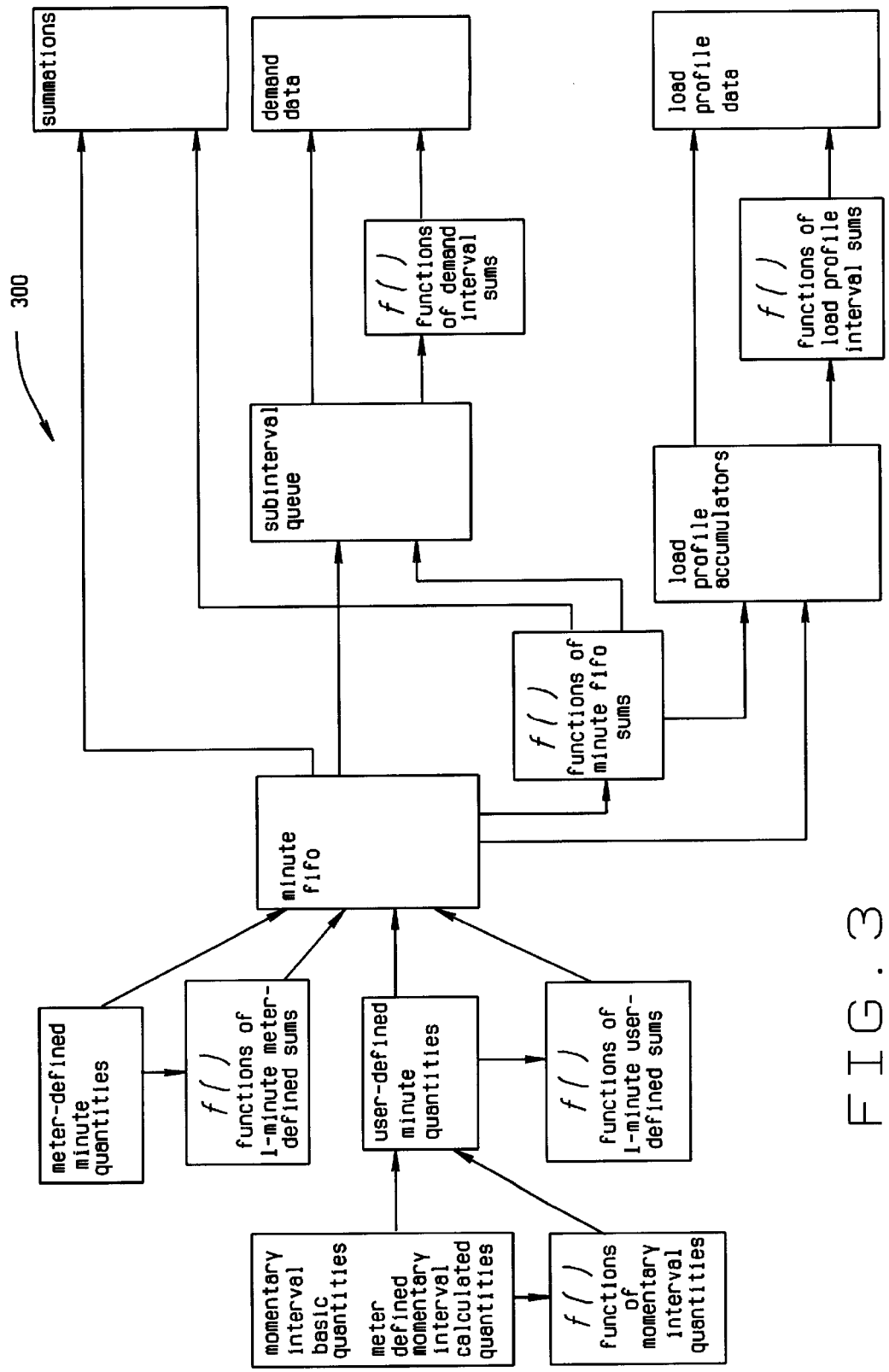
FIG. 3 is a functional block diagram of the meter shown in FIG. 1.

FIG. 3 is a functional block diagram 300 of meter 100. The f( ) blocks in FIG. 3 illustrate the points during data processing at which user-defined functions can be applied to data. For example, if a user wants to compute apparent volt-ampere-hours (defined as the vector sum of watt-hours, var-hours, and distortion volt-ampere hours), the user defines a function that would be executed at the end of each momentary interval. This quantity could then be accumulated for summations, demands, or load profile data. Accumulations of apparent volt-ampere-hours could also be used to compute some other quantity at a different point (e.g. a demand interval accumulation of apparent volt-ampere-hours could be used to compute an average power factor for that demand interval). Examples of some of the mathematical operators that would be available are set forth in the table below. These functions are programmed into the meter non-volatile memory.

Meter 100 can also accumulate data provided by external devices such as other electricity meters, gas meters, and water meters. Typically this is done through hardware that provides pulses to the electricity meter, which counts the pulses (each pulse represents some pre-defined value, e.g. 1 watt-hour). Meter 100 allows mathematical operations to be defined that operate on accumulations of these pulses. For example, a utility might have an installation where three electricity meters are required. By having two of the meters provide pulse data to the third meter representing watt-hour usage, and defining in the third meter a calculation to add the pulse data from the other two meters to its own watt-hour data, the utility can read the total watt-hour usage of the installation from one meter Because a user can specify mathematical operations to be performed on data at a number of steps in the processing of metering data, meter 100 provides that a wide variety of quantities can be determined. Meter 100 also prevents the meter manufacturer from having to anticipate at the product development stage what quantities a utility might require. Since there are constraints that a user must be aware of when programming a meter to compute a given quantity, it is likely that the meter manufacturer would implement for the utility the program that defines the calculations. The utility would then install the program into its programming software package, which would ultimately download the program into meter 100.

TABLE 1

| Momentary interval basic quantities |
| --- |
| watt-hours, element A, fundamental + harmonics |
| watt-hours; element B, fundamental + harmonics |
| watt-hours; element C, fundamental + harmonics |
| var-hours, element A, fundamental + harmonics |
| var-hours, element B, fundamental + harmonics |
| var-hours, element C, fundamental + harmonics |
| watt-hours; element A, fundamental only |
| watt-hours; element B, fundamental only |
| watt-hours; element C, fundamental only |
| var-hours, element A, fundamental only |
| var-hours, element B, fundamental only |
| var-hours, element C, fundamental only |
| volt-squared-hours, element A, fundamental + harmonics |
| volt-squared-hours, element B, fundamental + harmonics |
| volt-squared-hours, element C, fundamental + harmonics |
| ampere-squared-hours, element A, fundamental + harmonics |
| ampere-squared-hours, element B, fundamental + harmonics |
| ampere-squared-hours, element C, fundamental + harmonics |
| ampere-squared-hours, element A, fundamental only |

TABLE 1-continued

Momentary interval basic quantities ampere-squared-hours, element B, fundamental only
ampere-squared-hours, element C, fundamental only
volt-squared hours, element A, fundamental only
volt-squared hours, element B, fundamental only
volt-squared hours, element C, fundamental only
sample count
imputed neutral ampere-squared-hours

TABLE 2

Other data definitions

Functions of momentary interval basic quantities (user defined)

momentary interval calculation 1
momentary interval calculation 2
. . .
momentary interval calculation K
Functions of momentary interval basic quantifies (meter defined)

momentary interval total wh all harmonic
momentary interval total varh all harmonic
momentary interval total Wh fundamental
momentary interval total varh fundamental
Distortion Vah A
Distortion Vah B
Distortion Vah c
Total Distortion VAh
Meter-defined minute quantities one minute accumulation of pulses from channel 1
one minute accumulation of pulses from channel 2
. . .
One minute accumulation of pulses from channel L
delivered Wh
lagging varh during delivered Wh
leading varh during delivered Wh
received Wh
lagging varh during received Wh
leading varh during received Wh
User-defined minute quantities one minute sum 1 of momentary interval basic quantities
one minute sum 2 of momentary interval basic quantities
. . .
one minute sum M of momentary interval basic quantities
one minute sum 1 of moment. Int. qtys (user-defined)
one minute sum 2 of moment. Int. qtys (user-defined)
. . .
one minute sum N of moment. Int qtys (user-defined)
one minute sum 1 of moment. Int. qtys (meter-defined)
one minute sum 2 of moment. Int. qtys (meter-defined)
. . .
one minute sum P of moment. Int. qtys (meter-defined)
Functions of one minute user-defined sums (user-defined)

function 1 of other one minute user-defined sums
function 2 of other one minute user-defined sums
. . .
function Q of other one minute user-defined sums
Functions of one minute meter-defined sums (user-defined)

function 1 of other one minute meter-defined sums
function 2 of other one minute meter-defined sums
. . .
function R of other one minute meter-defined sums
Functions of minute fifo sums (user-defined)

function 1 of minute fifo sums
function 2 of minute fifo sums
. . .
function S of minute fifo sums TABLE 2-continued Other data definitions Demand interval sums (stored in subinterval queue)

demand interval sum 1 of one minute user-defined qtys
demand interval sum 2 of one minute user-defined qtys
. . .
demand interval sum T of one minute user-defined qtys
demand interval sum 1 of one minute meter-defined qtys
demand interval sum 2 of one minute meter-defined qtys
. . .
demand interval sum U of one minute meter-defined qtys
Functions of demand interval sums (user-defined)

function 1 of other demand interval sums
function 2 of other demand interval sums
. . .
function V of other demand interval sums
minimum value 1 during demand interval
minimum value 2 during demand interval
. . .
minimum value W during demand interval
maximum value 1 during demand interval
maximum value 2 during demand interval
. . .
maximum value X during demand interval
Load profile interval sums (stored in load profile accumulators)

load profile interval sum 1 of one minute user-defined qtys
load profile interval sum 2 of one minute user-defined qtys
. . .
load profile interval sum Y of one minute user-defined qtys
load profile interval sum 1 of one minute meter-defined qtys
load profile interval sum 2 of one minute meter-defined qtys
. . .
load profile interval sum Z of one minute meter-defined qtys
Functions of load profile interval sums (user-defined)

function 1 of other load profile interval sums
function 2 of other load profile interval sums
. . .
function A of other load profile interval sums
minimum value 1 during load profile interval
minimum value 2 during load profile interval
. . .
minimum value B during load profile interval
maximum value 1 during load profile interval
maximum value 2 during load profile interval
. . .
maximum value C during load profile interval min and max values may be voltage, frequency, current, etc.

TABLE 3

Example mathematical operations

| | | |
|---|---|---|
| WORD square root | WORD_SQUARE_ROOT pointer to operand (DWORD*) pointer to result (WORD*) | pointer to results: final answer working space location 1 working space location 2 . . . working space location N |
| WORD 2-D vector sum | WORD_2D_VECTOR_SUM pointer to operand 1 (INT*) pointer to operand 2 (INT*) pointer to result (WORD*) | |
| DWORD 2-D vector sum | DWORD_2D_VECTOR_SUM pointer to operand 1 (LONG*) pointer to operand 2 (LONG*) pointer to result (DWORD*) | data types BYTE: unsigned 1-byte qty INT: signed 2-byte qty WORD: unsigned 2-byte qty |

TABLE 3-continued

Example mathematical operations

| | | |
|---|---|---|
| | | LONG: signed 4-byte qty<br>DWORD: unsigned 4-byte qty |
| WORD 3-D vector sum | WORD_3D_VECTOR_SUM<br>pointer to operand 1 (INT*)<br>pointer to operand 2 (INT*)<br>pointer to operand 3 (INT*)<br>pointer to result (WORD*) | |
| DWORD 3-D vector sum | DWORD_3D_VECTOR_SUM<br>pointer to operand 1 (LONG*)<br>pointer to operand 2 (LONG*)<br>pointer to operand 3 (LONG*)<br>pointer to result (DWORD*) | |
| WORD 3-D vector difference | WORD_3D_VECTOR_DIFF<br>pointer to operand 1 (INT*)<br>pointer to operand 2 (INT*)<br>pointer to operand 3 (INT*)<br>pointer to result (WORD*) | |
| DWORD 3-D vector difference | DWORD_3D_VECTOR_DIFF<br>pointer to operand 1 (LONG*)<br>pointer to operand 2 (LONG*)<br>pointer to operand 3 (LONG*)<br>pointer to result (DWORD*) | |
| INT multiply | INT_MULT<br>pointer to operand 1 (INT*)<br>pointer to operand 2 (INT*)<br>pointer to result (LONG*) | |
| general multiply | MULT_MB (written in C)<br>size of operand 1 (BYTE)<br>pointer to operand 1 (BYTE*)<br>size of operand 2 (BYTE)<br>pointer to operand 2 (BYTE*)<br>pointer to result (BYTE*) | |
| INT divide | INT_DIVIDE<br>pointer to operand 1 (LONG*)<br>pointer to operand 2 (INT*)<br>pointer to result (INT*) | |
| general divide (not available at momentary interval boundary) | DIV_MB<br>size of operand 1 (BYTE)<br>pointer to operand 1 (BYTE*)<br>size of operand 2 (BYTE)<br>pointer to operand 2 (BYTE*)<br>pointer to result (BYTE*) | |
| INT add | INT_ADD<br>pointer to operand 1 (INT*)<br>pointer to operand 2 (INT*)<br>pointer to result (INT*) | |
| INT to LONG add | INT_TO_LONG_ADD<br>pointer to operand 1 (LONG*)<br>pointer to operand 2 (INT*)<br>pointer to result (LONG*) | |
| LONG add | LONG_ADD<br>pointer to operand 1 (LONG*)<br>pointer to operand 2 (LONG*)<br>pointer to result (LONG*) | |
| general add (not available at momentary interval boundary) | ADD_MB<br>size of operand 1 (BYTE)<br>pointer to operand 1 (BYTE*)<br>size of operand 2 (BYTE)<br>pointer to operand 2 (BYTE*)<br>pointer to result (BYTE*) | |
| LONG subtract | LONG_SUB<br>pointer to operand 1 (INT*)<br>pointer to operand 2 (INT*)<br>pointer to result (INT*) | |
| general subtract | SUB_MB<br>size of operand 1 (BYTE)<br>pointer to operand 1 (BYTE*)<br>size of operand 2 (BYTE)<br>pointer to operand 2 (BYTE*)<br>pointer to result (BYTE*) | |
| assignment | ASSIGN<br>data type (1, 2, or 4 byte qty)<br>constant<br>pointer to destination | |
| fill | FILL<br>number of bytes to fill (BYTE)<br>fill value (BYTE)<br>pointer to destination (BYTE*) | |
| if-then-else | IF<br>pointer to operand 1<br>comparison<br>pointer to operand 2<br>comparison TRUE operation 1<br>comparison TRUE operation 2<br>. . .<br>comparison TRUE operation N<br>ENDIF or ELSE<br>else operation 1<br>else operation 2<br>. . .<br>else operation P<br>ENDIF | |
| no operation | NOP | |

Flash Memory

In one embodiment, a nonvolatile, alterable flash memory 118 is utilized to store configuration, diagnostic, metering and other data. Flash memory 118 provides the advantage that a tremendous amount of data can be stored, which eliminates a need for a daughter board to add additional memory. Also, a data manager maps requests for data to the physical location of the data. By utilizing the data manager, data can move from one storage medium to another without affecting the metering application.

Flash memory 118 is typically organized into multiple large sectors (64 KB) which can be erased in their entirety. When flash memory is erased, all bits in a sector are set to 1. When data is written, 1 bits are changed to 0 bits. Once a bit has been changed to a 0, it cannot be changed back to a 1 without erasing the entire sector.

For practical purposes, a given location in flash memory can be written to once after it has been erased. To update even a single byte in a record, a new copy of the entire record is written to an unused location. There are many known methods for tracking used, unused and obsolete memory in each sector including file allocation tables (FAT) and linked lists. When a sector becomes full, it is necessary to transfer all "active" records to an unused sector and then erase the "dirty" sector.

Data within meter 100 is organized into logical blocks (e.g. Current Season rate A data, Previous Reset data, Previous Season Data) that are treated as atomic data units (ADU) by the data manager. Each ADU is managed separately. The data manager is responsible for maintaining a pointer to the physical location of the current copy of each ADU. For the metering application to update an ADU stored in flash memory 118, a new copy of the ADU is written to an unused portion of flash memory 118. Since the physical location of the ADU has changed, the pointer to the current ADU is updated. Keeping a pointer to the current ADU eliminates the need to traverse a linked list through flash memory 118 to find the current ADU at the end of the chain.

The list of pointers to current ADUs maintained by the data manager may be kept in RAM or non-volatile memory. The list, however, is saved in non-volatile at power failure. If stored in flash memory 118, each change to a single ADU requires rewriting the entire list of pointers. Another approach is to maintain the list of pointers in EEPROM 120. With EEPROM 120, only the pointers to affected ADUs must be updated.

ADUs can be combined into logical groupings that are stored in a common set of flash sectors. These logical groupings can be based on, for example, the frequency with which the ADUs are updated and, the size of the ADUs. Each logical grouping of ADUs has at least two sectors dedicated to data storage. One or more sectors are "active", and the remaining sector is erased and available when the last "active" sector fills up. Possible groupings of ADU's include power fail data and communications snap shots, configuration and revenue data, self-reads and event logs, and load profile data.

The data manager also performs a garbage collection task that monitors each group of sectors. When the active sector(s) in a group is full, the garbage collection task initiates the copying of all active ADUs in the oldest sector to a new sector. The copying is done atomically, one ADU at a time. When an ADU is copied to the new sector, the pointer to the current ADU is updated to match its physical location in the new sector.

Meter 100 can service a power failure in the middle of garbage collection and pick up where it left off without losing any data, and minimizes the amount of time the power fail interrupt is disabled to permit the meter sufficient time to close down in an orderly fashion.

Determining when a sector is full can be done in one of many ways. A "high water" mark can be set for a sector. When the sector crosses that high water mark, garbage collection is initiated. The high water mark could be determined by the size of the largest ADU for a group. Alternatively, the data manager could wait to consider a sector full until it is unable to satisfy a request to allocate storage. If too much space is wasted at the end of the sector, the erase time will increase.

If a second set of pointers are used for data that affects the configuration of meter 100, this second set of pointers can be used to allow the "commitment" and "roll-back" of configuration information. At the beginning of a session to change the configuration, the pointers to the current configuration information are copied. When the configuration information is updated, the updated copy is written to flash and the "copy" pointer is updated. After all configuration information has been written, a command to indicate that the configuration is complete is issued. At that point, the current pointers are updated with copies of the updated pointers. If the configuration process is interrupted before it completes, meter 100 maintains the current configuration. The old configuration information is still available in flash since the original pointers and data were not changed.

Nonvolatile, alterable flash memory and vectors also can be utilized to update the firmware of microcomputer 114 while meter 100 is in service. As explained above, meter 100 uses vectors to functions and/or tasks to provide a level of indirection that can be used to upgrade or patch the code. Meter 100 includes two forms of program memory, specifically, on-chip masked ROM or flash and off-chip flash 118. The on-chip masked ROM typically has a speed advantage over off-chip memory. Time critical functions are stored in the on-chip masked ROM. Other, non-time critical features are stored in either on-chip masked ROM or off-chip flash 118. For the initial release of the firmware, the on-chip masked ROM could be filled with as much firmware as is practical.

The off-chip flash 118 can be used to store vectors to functions, tasks and/or tables of tasks to be executed and non-time critical functions and tasks. The vectors in the table point to functions or tasks stored in on-chip masked ROM or off-chip flash 118. At power up, these vectors and tables are read into memory. Rather than call a function and/or task directly, the firmware uses the vectors to call functions and/or tasks.

The firmware can be upgraded in multiple ways. For example, a function or task stored in off-chip flash can be directly over written, replacing the old code with new code, or a new function or task can be written to off-chip flash and the corresponding vector updated to point to the new function or task.

A built-in "bootloader" allows new code to be downloaded into the off-chip flash. Meter 100 ceases metering when the bootloader is initiated. The bootloader accepts blocks of new code and writes them to the off-chip flash 118. When the download is complete, meter 100 "reboots" and begins executing with the new code.

Commercially available off-chip flash memories permit programming without any special voltages. In addition, such off-chip flash memories combine two "banks" of memory that act like separate chips. One bank of the chip can be used for code storage. The other bank can be used for data storage. Each bank operates independent of the other. One can be programmed while the other is being read. One such chip can be used to store off-chip code and data.

In other embodiments, a large electrically erasable programmable (i.e., reprogrammable) read only memory (EEPROM) is used for part of the nonvolatile, alterable memory. In this embodiment, some of the data that is described above as being stored in flash memory is stored, instead, in the EEPROM. However, the load profile is still stored in flash memory 118.

It should be recognized that in still other embodiments, other types of nonvolatile, alterable memory can be substituted for EEPROM and flash memory 118. The memory or memories used should retain their contents during periods when power is not applied, and it should be possible to update their contents as needed, although not necessarily in the manner required by a flash memory. One skilled in the art would be able to select appropriate memories and make the necessary circuit modifications to use the selected memory or memories.

I/O Board Addressing

As described above with reference to FIG. 1, meter 100 includes an option connector 128 which connects to both simple and complex input/output board (I/O) boards 136 and 138. Flash memory 118 enables functional expansion of meter 100, and such expansion is further facilitated by enabling use of multiple types of I/O boards 130. To facilitate such board interchangeability, microcomputer 114 is programmed to determine the type of I/O board 130 which is being utilized. FIG. 4 illustrates the status of microcomputer pins utilized in connection with communication with I/O board 130. The pin positions relate to the identified signals. Microcomputer 114 is operable in a normal mode, and ID mode, and address mode, a read mode, and a write mode with respect to such I/O board 130.

As explained above, multiple types of boards can be provided, and each board type has an identifier. In one specific embodiment, a 3-bit address specifies the board type. For example, an input/output board is specified as a type 001. A logic 0 on all response lines means no option board of the specified type is present. A simple I/O board 136 has an identifier of 01. A complex I/O board 138 has an identifier of 10.

FIG. 5 is an exemplary mode diagram for signals of a simple I/O board 136. The signal supplied to I/O board 136 controls the mode of operation of the board, e.g., ID mode, address mode, read mode, and write mode. "X" means "don't care", and "N/A" means "not available". In the write mode, for KYZ outputs, a logic 1 closes the K-Z contact and opens the K-Y contact. For a 2-wire output, a logic 1 closes the output contact.

FIG. 6 illustrates an exemplary mode diagram for signals at a complex I/O board 138. Again, the signal supplied to I/O board 138 controls the mode of operation of the board, e.g., ID mode, address mode, read mode (nib 0), read mode (nib 1), write mode (nib 0), and write mode (nib 1). In the read mode, logic 1 indicates the corresponding input is activated. For 2-wire inputs, only the Z inputs are used. In the write mode, for KYZ outputs, a logic 1 closes the K-Z contact and opens the K-Y contact. For 2-wire outputs, a logic 1 closes the output contact.

Fast Optocom

As shown in FIG. 1, meter 100 includes an optical port 122 for communications with external hand held units and other devices. To enable such communications, both the external unit and optical port 122 include phototransistors. Meter 100 can store significant volume of data (e.g., 2 months of load profile data for 20 channels), and it is desirable to quickly transmit such data to a hand held unit during a communication session. A phototransistor, however, requires that the voltage across the transistor must change in order to switch from a first state to a second state.

To facilitate faster communications, op-amps are connected to the phototransistors. Each op-amp is configured as a current to voltage converter. The op-amp therefore maintains a constant voltage across the phototransistor. As a result, the output can change between a first state and a second state with minimal impact on phototransistor voltage.

Waveform Capture

Microcomputer 114 is programmed to capture waveform data (gain and phase corrected samples) upon the occurrence of a predetermined event. An event may, for example, be that the voltage in one of the phases falls below a predetermined percentage of a reference voltage, the voltage in one of the phases rises above a predetermined percentage of a reference voltage, or a power fail transient is detected. Waveform capture is activated by setting a waveform capture flag, and if the flag is set, a waveform counter is set to a predetermined count, e.g., 70. Upon the occurrence of the event, and if the waveform capture flag is set and if the counter has a value greater than 0, then voltage samples and current samples for each phase are stored in RAM. These samples are stored after DAP 112 interrupts the main process running in microcomputer 114 and the DSP interrupt service routine is invoked. The counter is decremented, and if the counter still has a value greater than 0, then the voltage samples and current samples for each phase at that time are stored. These samples are also stored after the DAP 112 interrupts the main process and the DSP interrupt routine is serviced. Operations continue in this manner so that upon the occurrence of an event, the desired waveform data is collected.

In one embodiment, microcomputer 114 can be programmed to collect more or less than 70 samples per waveform from a set of six waveforms (three current waveforms and three voltage waveforms). For example, the amount of data collected can be programmed based on the type of triggering event.

Revenue Guard Plus

Microcomputer 114 is programmable to determine energy consumption and other metering quantities for many different form types. In addition, and if one phase voltage is lost during metering operations and the other two phase voltages are still available, microcomputer 114 automatically converts from a three voltage source metering operation to a two voltage source metering operation. For example, and if metering is being performed with three input voltage sources $V_a$, $V_b$, and $V_c$, and if one of the phase voltages, e.g., $V_a$, is lost, microcomputer 114 automatically changes to metering to the appropriate form type, i.e., generating metering quantities using $V_b$ and $C_c$.

More specifically, an in an exemplary embodiment, microcomputer 114 is operable to perform metering in accordance with multiple form types. A case number is assigned to each form type depending, for example, upon the number of elements and the number of wires. For example, form type 6 corresponds to a WYE configuration when all voltages $V_a$, $V_b$, and $V_c$ are present. Form types 7, 2, and 8 correspond to metering operations performed when $V_a$, $V_b$, and $V_c$, respectively, are absent. If microcomputer 114 is operating in accordance with type 6 and voltage $V_a$ is lost ($V_a = -[V_b + V_c]$), then microcomputer automatically converts to metering in accordance with form type 7. Similarly, if voltages $V_b$ or $V_c$ are lost, then microcomputer 114 automatically converts to metering in accordance with form type 2 or form type 8, respectively. Therefore, rather than discontinuing metering and possibly losing metering data, meter 100 automatically converts to another form type in the event that one of the phase voltages is lost. In one embodiment, meter 100 converts to a 2½ element meter. After a programmable interval, voltage is checked again and an appropriate type (6, 2, 7 or 8) is then invoked.

In one embodiment, determining whether voltage $V_a$ is lost comprises checking three consecutive times at a 15 second interval after switching back to DSP form type 6. Also, in one embodiment, $V_a$ is considered "lost" when it drops to one-half of the normal voltage. In yet another embodiment, at least one of the number of consecutive checks made before $V_a$ is deemed lost, the interval between the checks, and the voltage at which $V_a$ is deemed lost is programmable.

Long Communication Session

When an external reader attempts to obtain data from meter 100, and since a large volume of data can be stored in the meter memory, it is desired to provide the reader with a snap shot of data at a particular point in time, rather than accessing the different metering data at different points in time during one communication session. If different data is accessed at different points in time, then it is possible that the metering data will not be consistent, especially if the communication session is long, e.g., 1 hour. For example, a load 142 continues to consume energy during a read operation, and if the communication session requires more than a few minutes to complete, the metering data collected at the beginning of the session will not necessarily correspond to the metering data collected at the end of the session.

Accordingly, in one embodiment, upon receipt of a request for a communication session, e.g., reading a revenue table or a communication requiring a billing read command, microcomputer 114 generates a static copy of selected revenue-related data. For example, the current load profile data is written to EEPROM 120, or a static copy is made in RAM. This snapshot of data is then read out by the reader/host via port 122.

In one embodiment, microcomputer 114 generates the static copy of selected revenue-related data in response to a PSEM command.

By storing the snapshot of data and providing such snapshot of data to the external device, the read data all corresponds to a particular point in time and is consistent, i.e., the data read at minute 1 of the session is obtained under the same circumstance as the data read at minute 60 of the session.

Rollback

In the event that meter 100 is to be updated or reprogrammed during operation, the following procedure is performed to ensure that the update, or new program, is executed as quickly as possible upon initiation of the change. Specifically, EEPROM 120 includes storage locations for active and inactive metering programs, i.e., an active program segment and an inactive program segment. The program currently being utilized by meter 100 is stored in the active program segment of EEPROM 120. The active program controls include, for example, display scroll parameters, time-of-use data, a calendar, season change, and holidays. Billing data is generated in accordance with the active program.

In the event that an update to the active program is required, or in the event that an entirely new program is to be utilized, then a host writes the updated/new program to the inactive segment in EEPROM 120. Upon initiation of writing the updated/new program to EEPROM 120, meter microcomputer 114 also interrupts the then active program and the metering data is stored in the meter memory. Upon successful completion of the program update, or loading the new program, microcomputer 114 designates the inactive segment containing the new program as the active segment, and causes metering operations to then proceed. The metering data stored in the meter memory during the update is processed by the new program.

By interrupting metering program operations during the update, and storing the metering data collected during the update and processing such data with the new program once the new program is loaded, the new program is utilized in metering operations as soon as possible. Such operation sometimes is referred to as "rollback" because meter 100 "rolls back" to a previous configuration if a change to a current configuration is interrupted before it is completed. In this manner, meter 100 is not left in an inconsistent state, and can continue operating with a previously programmed set of parameters. (Previously, meters would lose their programs entirely if programming were interrupted.)

If the new program is not successfully written into the inactive segment, then microcomputer 114 does not change the designation of the active segment and metering continues with the program stored in the active segment. Specifically, the metering data collected during the attempted update is processed using the program in the active segment and metering operations continue.

Diagnostics

The following diagnostic operations are performed by meter microcomputer 114. Of course, additional diagnostic operations could be performed by microcomputer 114, and fewer than all the diagnostic operations described below could be implemented. Set forth below are exemplary diagnostic operations and a description of the manner in which to perform such operations. In one exemplary embodiment, diagnostics 1–5 and 8 are checked once every 5 seconds. Also in this embodiment, diagnostics 6 and 7 are checked once every second. A programmable number of consecutive failures are permitted for diagnostics 1–5 and 8, and another, different, programmable number of consecutive failures are permitted for diagnostics 6 and 7 before a diagnostic error results.

Diagnostic #1 (Polarity, Cross Phase, Rev. Energy Flow)

This diagnostic verifies that all meter elements are sensing the correct voltage and current for the electrical service. In an exemplary embodiment, this diagnostic is accomplished by comparing each voltage and current phase angle with expected values. In one specific embodiment, voltage phase angles must be within ten degrees of the expected value and current phase angles must be within 120 degrees of the expected value to prevent a diagnostic 1 error.

Diagnostic #2 (Phase Voltage Alert)

This diagnostic verifies that the voltage at each phase is maintained at an acceptable level with respect to the other phases. In an exemplary embodiment, and for diagnostic 2 tests, the A phase voltage is combined with the user programmed percentage tolerance to determine the acceptable range for the B and C phases voltages as appropriate for the ANSI form and service type. For a 4 wire delta service, $V_c$ is scaled before being compared to $V_a$. In one embodiment, this diagnostic is not performed if $V_a$ is bad.

Diagnostic #3 (Inactive Phase Current)

This diagnostic verifies that the current of each phase is maintained at an acceptable level. A diagnostic 3 error condition is triggered if the current of one or more phases, as appropriate for the ANSI form and service type, falls below a user programmed low current value and at least one phase current remains above this value.

Diagnostic #4 (Phase Angle Alert)

This diagnostic verifies that the current phase angles fall within a user a specified range centered on expected values. In an exemplary embodiment, diagnostic #4 is enabled only if diagnostic #1 is enabled and is checked only if diagnostic #1 passes. The user programmed current phase angle tolerance value for diagnostic #4 has a range of zero to ninety degrees in increments of $1/10$ degree.

Diagnostic #5 (Distortion Alert)

This diagnostic verifies that the user-selected form of distortion measured on each individual element and, in the case of distortion power factor, across all elements, is not excessive. This diagnostic is selectable to monitor one of the following distortion measures.

Distortion Power Factor (DPF), per element and summed

Total Demand Distortion (TDD), per element only

Total Harmonic Current Distortion (ITHD), per element only

Total Harmonic Voltage Distortion (VTHD), per element only, if a valid element.

A diagnostic 5 error condition is triggered if any of the distortion calculations exceed a user-specified threshold.

Four counters are associated with diagnostic 5 (one counter for each element, and for DPF only, and one counter for the total of all elements). In an exemplary embodiment, diagnostic 5 is checked only when the one second kW demand exceeds a user programmed threshold which is the same demand threshold used for the power factor threshold output. The user programmed distortion tolerance value for diagnostic 5 has a range of 0 to 100% in increments of 1%.

Diagnostic 6 (Undervoltage, Phase A)

This diagnostic verifies that the phase A voltage is maintained above an acceptable level. In an exemplary embodiment, the user programs an undervoltage percentage tolerance for diagnostic 6 that has a range of 0 to 100% in increments of 1%. A diagnostic 6 error condition is triggered if the voltage at phase A falls below the reference voltage (Vref) minus the undervoltage percentage tolerance (T).

Fail Condition: Va<Vref(100%−T%), for a programmable number of consecutive checks.

The threshold used for diagnostic 6 is also used for the potential annunciators.

Diagnostic #7 (Overvoltage, Phase A)

This diagnostic verifies that the phase A voltage is maintained below an acceptable level. In an exemplary embodiment, the user programs an overvoltage percentage tolerance for diagnostic 7 that has a range of 0 to 100% in increments of 1%. A diagnostic 7 error condition is triggered if the voltage at phase A rises above the reference voltage (Vref) plus the overvoltage percentage tolerance (T).

Fail Condition: Va>Vref(100%+T%)

Diagnostic #8 (High Imputed Neutral Current)

This diagnostic verifies that the imputed neutral current is maintained below an acceptable level. In an exemplary embodiment, a diagnostic 8 error condition is triggered if the imputed neutral current exceeds a user-programmed threshold. Form 45 and 56 as 4WD and 4WY applications are not valid services for determining the imputed neutral values. In these cases, the imputed neutral is zeroed after the service type has been determined.

Meter 100 includes an event log stored in meter memory for capturing information about events. The event log is used, for example, to store the occurrence of events, such as a diagnostic condition sensed as a result of performing one of the tests described above.

In addition, and using complex I/O board 138, an output can be generated by microcomputer 114 to such board 138 to enable remote determination of a diagnostic failure. Such capability is sometimes referred to as a Diagnostic Error Alert. When configured for a diagnostic error alert, the following designation may be used to correlate a diagnostic error condition to an output.

| Function | Bit |
|---|---|
| Diagnostic 1 | 0 |
| Diagnostic 2 | 1 |
| Diagnostic 3 | 2 |
| Diagnostic 4 | 3 |
| Diagnostic 5 | 4 |
| Diagnostic 6 | 5 |
| Diagnostic 7 | 6 |
| Diagnostic 8 | 7 |

For example, an output of 01010101 provides a diagnostic error alert for diagnostic tests 1,3,5, and 7.

When one of the selected diagnostics is set, the output is set. When all selected diagnostics are cleared, the output is cleared. Diagnostic operations are not performed when meter 100 is determining the electrical service.

Programmable Durations

In one specific embodiment, the diagnostic tests described above, except diagnostics 6 and 7 (undervoltage and overvoltage), are performed every 5 seconds using one second worth of data. Diagnostics 6 and 7 are performed every second. If a diagnostic fails each check performed during a programmed duration which begins with the first failed check, the diagnostic error is set and the diagnostic counter is incremented.

In an exemplary embodiment, two programmable diagnostic fail durations are provided. One programmable fail duration is for diagnostics 6 and 7, and one programmable fail duration for the other diagnostics. The fail duration for diagnostics 6 and 7 is programmable from 3 seconds to 30 minutes in 3 second increments. The fail duration for the remaining diagnostics is programmable from 15 seconds to 30 minutes in 15 second increments.

In the exemplary embodiment, two consecutive error free checks are required to clear a diagnostic error condition. The range for all diagnostic counters is 0 to 255. When a diagnostic counter reaches 255, it must be reset by a user. Diagnostic errors and counters may be reset via communications procedures.

Totalizations

As explained above, meter 100 includes a measurement profile 204 that accepts external inputs. The external inputs can, for example, be pulse inputs from other meters associated with a load, e.g., a manufacturing plant. The external inputs can be collected, scaled (e.g., every minute), and then totaled (i.e., summed together) to provide a quantity of total energy consumed from one plant. The totalized value can then be stored in one location. In addition, internal quantities can be totalized (e.g., user-selected quantities can be totalized).

Data Accumulators

In one embodiment, microcomputer 114 includes a 64 KB on-board RAM, microcomputer 114 is programmed to accumulate values in its RAM, and these accumulated values are then subsequently displayed on display 124. By programming microcomputer 114 to store and accumulate data in this manner, meter 100 can accumulate metering data for display to an operator. Moreover, a utility company can monitor many quantities without having data by time of use rate, demand reset, seasonal change, etc.

Load Profile

Electricity meters typically store integrated quantities as load profile data. In addition to adding quantities, meter 100 can be programmed to store the maximum and minimum or most recent quantities, i.e., meter 100 can track non-integrated quantities. A user, therefore, can select up to 20 quantities for recording. Accordingly, microcomputer 114 is programmed to compare the maximum and minimum values at every interval with the stored quantities, and if a new maximum or minimum is detected, the new maximum or minimum is stored in the appropriate recorder channel.

Demand

As with load profile data, microcomputer 114 is programmed to compare the demand value at every interval with a stored maximum demand in, for example, the on-board RAM. If the current demand is greater than the stored maximum demand, then the current demand is copied over the stored maximum demand and stored. In addition, for non-integrated quantities, momentary by momentary interval comparisons can also be performed.

Coincident Power Factors

Meter 100 is configurable to determine multiple types of demands, such as kW, kVAr, kVA, and distortion KVA. For each demand, there are other, e.g., two, coincident values. Accordingly, meter microcomputer 114 determines, on each interval, demand values and compares the calculated demand values to the stored maximum values. If one of the then calculated values is greater than the corresponding demand stored value, i.e., the current value is the maximum, then the value of the other demands is of interest. Specifically, power factor is the quotient of two of the demands, and two coincident power factors can be determined and stored. For example, if there are five demand types, an operator can specify that upon the occurrence of a maximum demand, two coincident power factor values are stored, e.g., Demand 1/Demand 2 and Demand 3/Demand 4.

Multiple Distortion Measurements

Meter microcomputer 114 also is configured to calculate distortion power factor for each element (e.g., distortion Vah/apparent Vah). Microcomputer 114 also calculates a sum of the element distortion power factors, and $V_{THD}$, $I_{THD}$, and $T_{DD}$, all per element. The equations used to calculate these values are well known. In meter 100, the multiple distortion measurements are available for display, and the calculations are performed every momentary interval.

Bidirectional Measures

Microcomputer 114 is further configured to determine, for every momentary interval, the quadrant in which user-selected quantities and other metering quantities such as watthours are being measured. As is well known in the art, the quadrants are defined by real (Wh) and imaginary (VAR). Meter 100 therefore tracks the quadrant in which energy is being received/delivered. Such measurements are specified by the user in measurement profile 204.

Transformer Loss Compensation

Microcomputer 114 is configured to compensate for energy losses that occur within distribution transformers and lines. Such compensation is enabled if a user selects this option. Transformer loss compensation (TLC) is applied to momentary interval per element Wh, Varh, and Vah data. The transformer model for loss compensation is based on the following relationships with metered voltage and current as variables.

No-load (core) (iron) loss watts are proportional to $V^2$
Load (copper) loss watts are proportional to $I^2$
No-load (core) (iron) loss vars are proportional to $V^4$
Load (copper) loss vars are proportional to $I^2$
Line losses are considered as part of the transformer copper losses.

Every momentary interval, the signed losses for each element (x=a, b, c) are determined using the TLC constants and the measured momentary interval $V^2h$ and $I^2h$ for each element:

$LWhFe_x$=iron loss watt hours=$V_x^2 h*G$ $LWhCU_x$=copper loss watt hours=$I_x^2 h*R$ $LVarhFE_x$=iron loss var hours=$(V_x^2 h/h)*V_x^2 h*B/V^2$ $LVarhCU_x$=copper loss var hours=$I_x^2 h*X$ Compensated watt hours and var hours are then determined for each element by adding the signed losses to the measured momentary interval watthours and var hours.

Compensated $W_x h$=measured $W_x h+LWhFE_x+LWhCU_x$

Compensated $Varh_x$=measured $Varh+LVarhFE_x+LVarCU_x$

Momentary VAh calculations are made using the compensated watthours and var hours. The distortion component of the Vah value is not compensated for transformer losses.

Pending Actions

When operating in a time-of-use mode, a user may desire to implement a new real-time pricing schedule. In one embodiment, microcomputer 114 also checks every 15 minutes for a real-time pricing command.

More specifically, microcomputer 114 includes a real-time pricing mode for executing a specified real-time pricing (RTP) rate for as long as real-time pricing is active. Microcomputer 114 enters the RTP mode by, for example, a dedicated input from a modem board or an I/O board 130, or by a pending or immediate action. The inputs for RTP include setting an RTP procedure flag which indicates whether to enter or exit RTP. A RTP activation delay (time in minutes) delays entering RTP after the input has been activated. In one specific embodiment, the delay is programmable from 0 to 255 minutes.

During power-up, the saved RTP procedure flag and time remaining until RTP activation are retrieved from EEPROM 120 by microcomputer 114. After microcomputer 114 completes its initialization tasks, the following task are performed.

If the power outage crossed one or more quarter-hour boundaries, microcomputer 114 determines whether a pending RTP action was scheduled for one of the crossed quarter-hour boundaries.

If an RTP action was scheduled, microcomputer 114 determines what the pending RTP action was, and if the action was to enter RTP, microcomputer 114 enters RTP and sets the RTP procedure flag. The RTP activation delay does not delay entering the RTP rate via the pending action.

If the RTP pending action was to exit RTP, the RTP procedure flag is cleared.

If the RTP pending action was to exit RTP or no pending RTP action was scheduled to start during the outage, microcomputer 114 checks the status of the RTP input and the status of the RTP procedure flag. If RTP has been activated, or the enter RTP command had been sent prior to the power failure, microcomputer 114 checks the RTP activation delay timer. If the timer is zero, microcomputer 114 enters the RTP rate. Otherwise, microcomputer 114 enters the RTP rate after the timer expires.

During normal operation, microcomputer 114 checks the status of the RTP input. When microcomputer 114 detects that the RTP input has changed state from inactive to active, microcomputer 114 checks the programmed activation delay time. If the delay time is zero, microcomputer 114 enters the RTP rate. Otherwise, microcomputer 114 sets the activation delay timer and enters the RTP rate when the timer has expired.

During RTP mode operations, microcomputer 114 continues to calculate data accumulations, and average power factor and demands are calculated as when in the TOU metering mode. When the RTP signal is de-activated, microcomputer 114 checks the status of the RTP procedure flag. If the RTP procedure flag is not set, microcomputer 114 exits the RTP mode. Otherwise, microcomputer 114 remains in the RTP mode until the exit RTP immediate procedure is received or a pending exit RTP action is executed.

When microcomputer 114 exits RTP, microcomputer 114 returns to the TOU rate in effect for the time and date when the RTP ends. Microcomputer 114 processes any unprocessed summations and demand data. For block and rolling demand, the demand intervals end.

In one embodiment, meter 100 is also able to automatically install a new TOU schedule when a pending date/time is reached. This feature allows a new calendar and/or tier structure with setpoints. Generally, microprocessor 114 checks, at midnight of every day, for a pending TOU schedule. If, for example, a TOU schedule is pending for September 1 at midnight, the pending TOU schedule is loaded and becomes active.

Voltage Sags and Swells

The term voltage sag refers to a situation in which a phase voltage falls below a predetermined level, and the term voltage swell refers to a situation in which a phase voltage rises above a predetermined level. Voltage sags and swells generally are power quality concerns, and typically are associated with brown outs and similar events. In meter 100, and if a voltage sag or swell is detected, an event is logged in the event log, and the voltages and currents per event (e.g., maximum and minimum voltage and current per phase) are stored.

Thresholds are selected to compare the current voltage values against. Specifically, a sag threshold and a swell threshold are determined. For 120 to 480 V services, an exemplary threshold is:

$$\text{INT}\left(Voltage^2 \text{ units} \times \frac{1 \text{ hr}}{3600 \text{ sec}} \times \frac{1 \text{ sample}}{SF \times Voltage^2 \text{ hr}} \times 2 \times \frac{1 \text{ sec}}{3281.25 \text{ samples}} \times 2^{24}\right),$$

where SF is a scale factor equal to $3125 \times 10^{-6}$. For 57 to 120 V services, an exemplary threshold is given by the above equation, where $SF = 500 \times 10^{-6}$.

Mean voltages can be determined in accordance with the following:

$$\frac{V2x\_cycle\_acum}{sample\ count} \times 2^8.$$

Given the number of units in a cycle and the sample count, the mean measurement in volts is:

$$\sqrt{\left(\frac{\# \text{ units}}{\text{cycle}}\right) \times \left[\frac{SF \times V^2}{2 \times 2^{16}}\right] \times [3600 \text{ sec/hr}] \times \left[3281.25 \text{ samples/sec} \times \frac{1 \text{ cycle}}{\text{sample count}}\right]} = \sqrt{\frac{\# \text{ units} \times SF \times 90.122}{\text{sample count}}}$$

The $V^2$ cycle accumulations are accumulated every sample.

Remote Upgrade

Converting meter operation refers to enabling a user to selectively operate the meter in different metering modes, such as selectively operating a meter either a time of use (TOU) or demand metering mode. Specifically, and as described below in more detail, a user can convert meter operation from a demand only mode to a time of use mode, for example. In one form, the meter has three different modes. These modes are the demand only mode, the demand with load profile mode (sometimes referred to in the art as the demand with timekeeping mode), and the TOU mode.

In general, and in accordance with one aspect of the present invention, a soft switch is associated with optional features, and the soft switch enables remote upgrade and downgrade of the meter. The routines associated with the optional features are stored in meter memory, and when the soft switch for a particular feature is enabled, the routine for the enabled feature is executed, and tables become visible. Similarly, when the soft switch for a particular feature is not enabled, the routine for the not-enabled feature is not executed and tables are no longer visible.

Examples of optional features enabled and disabled by soft switches are listed below.

TOU
Expanded Measures
Basic Recording/Self-read
Event Log
Alternate Communications
DSP Sample Output
Pulse Initiator Output
Channel Recording/Self-reads
Totalization
transformer Loss Compensation
Transformer Accuracy Adjustment
Revenue Guard Plus
Voltage Event Monitor
Bi-Directional Measurements
Waveform Capture To downgrade meter function, e.g., remotely using a remote computer communicating with the meter via a communications option board, the meter memory is read to determine which soft switches are installed. An operator then selects a soft switch to be removed, and the appropriate file associated with the switch is disabled. If a significant change will result in removal of a switch, e.g., removing a TOU switch in a TOU meter, a warning message is displayed to the operator requesting confirmation that the selected switch should be removed.

To upgrade a meter, an operator selects a soft switch to be installed. The soft switch is then enabled in the meter and the particular tables and routines associated with the function for that switch are utilized during meter operations.

Additional details regarding upgrade/downgrade are set forth in U.S. patent application Ser. No. 08/565,464, filed Nov. 30, 1995, now U.S. Pat. No. 5,742,512, issued Apr. 21, 1998, and entitled ELECTRONIC ELECTRICITY METERS, which is assigned to the present assignee and hereby incorporated herein, in its entirety, by reference. In this application, at least some operations described as being performed in the DSP would be performed in the microcomputer of the present meter.

Meter Form Types

Meter 100 includes instruction sets identifying processing steps to be executed to determine line voltages and line currents for respective meter form types. Such instruction sets are stored, for example, in microcomputer memory. Microcomputer 114 is configured to receive a control command via optical port 122, and microcomputer 114 then processes the data received from ADC 112 in accordance with the selected instruction set.

The underlying process steps to make calculations such as reactive power and active power are dependent upon the meter form and the electrical circuit in which the meter is connected. For example, the meter form types includes meter ANSI form 9 and meter ANSI form 16 type forms, the number of elements may be 3, 2, 2½, or 1, and there are a number of circuit configurations in which the meter can be connected. The meter form, elements, and circuit configurations affect the inputs received by microcomputer 114 and the meter operation. Additional details regarding such operations are set forth in U.S. patent application Ser. No. 08/857,322, filed May 16, 1997, and entitled AN ELECTRONIC ELECTRICITY METER CONFIGURABLE TO OPERATE IN A PLURALITY OF METER FORMS AND RATINGS, which is assigned to the present assignee and hereby incorporated herein, in its entirety, by reference. In this application, at least some operations described as being performed in the DSP would be performed in the microcomputer of the present meter.

It will be seen that the above-described embodiments provide inexpensive methods and apparatus for upgrading an electronic electricity meter. Moreover, in some embodiments of the present invention, upgrades are not limited to tables and functions prestored in the meter, and can include new tables and functions.

While the invention has been described in terms of various specific embodiments, those skilled in the art will recognize that the invention can be practiced with modification within the spirit and scope of the claims.

What is claimed is:

1. A method for operating an electronic electric meter, the meter having current and voltage sensors configured to generate measurements of current and voltage, respectively; a microcomputer coupled to the current and voltage sensors and having on-chip masked read only memory (ROM); and a nonvolatile, alterable memory coupled to the microcomputer;

said method comprising the steps of:

storing vectors pointing to program portions of the ROM in the non-volatile memory;

reading the vectors into a memory of the microcomputer upon power up of the meter; and using the stored vectors to operate the microcomputer to execute the program portions stored in the ROM to control operation of the meter.

2. A method in accordance with claim 1 further comprising the steps of loading new code into the nonvolatile, alterable memory and of rebooting the meter to load and execute the new code.

3. A method in accordance with claim 2 further comprising the step of replacing vectors to the program portions in ROM with vectors to program portions in the new code.

4. A method in accordance with claim 1 wherein storing vectors pointing to program portions of the ROM in the non-volatile memory comprises the step of storing the vectors in flash memory.

5. A method in accordance with claim 4 wherein storing vectors pointing to program portions of the ROM in the non-volatile memory comprises the step of storing the vectors in electrically erasable programmable read only memory (EEPROM).

6. A method in accordance with claim 1 further comprising the step of storing a load profile in the nonvolatile, alterable memory.

7. A method in accordance with claim 6 wherein storing a load profile in the nonvolatile, alterable memory comprises storing a load profile in a flash memory.

8. A method in accordance with claim 1 wherein the nonvolatile, alterable memory comprises separate banks for code storage and data storage, and further comprising the step of operating wherein the separate banks independently of one another.

9. A method in accordance with claim 1 further comprising the steps of stopping metering when new code is downloaded into the nonvolatile, alterable memory, and of rebooting and executing the new code when a download is complete.

10. An electronic electric meter comprising:

current and voltage sensors configured to generate measurements of current and voltage, respectively;

a microcomputer coupled to said current and voltage sensors, said microcomputer having on-chip masked read only memory (ROM), said microcomputer being configured in conjunction with said ROM to control operation of said meter;

a nonvolatile, alterable memory coupled to said microcomputer and having stored therein vectors pointing to program portions of said ROM;

wherein said microcomputer is configured to read said vectors into a memory upon power up of said meter and to use said vectors to call said program portions of said ROM.

11. An electric meter in accordance with claim 10 configured to load new code into said nonvolatile, alterable memory and to reboot said meter to load and execute said new code.

12. An electric meter in accordance with claim 11 configured to replace vectors to said program portions in ROM with vectors to program portions in said new code.

13. An electric meter in accordance with claim 10 wherein at least a portion of said nonvolatile, alterable memory is flash memory.

14. An electric meter in accordance with claim 13 wherein at least a portion of said nonvolatile, alterable memory is electrically erasable programmable read only memory (EEPROM).

15. An electric meter in accordance with claim 10 having a load profile stored in said nonvolatile, alterable memory.

16. An electric meter in accordance with claim 15 wherein the load profile is stored in a flash memory.

17. An electric meter in accordance with claim 10 wherein said nonvolatile, alterable memory comprises separate banks for code storage and data storage, and wherein said separate banks operate independently of one another.

18. An electric meter in accordance with claim 10 configured to cease metering when new code is downloaded into said nonvolatile, alterable memory, and to reboot and begin executing the new code when a download is complete.

* * * * *